(12) United States Patent
Zhang et al.

(10) Patent No.: US 8,686,798 B2
(45) Date of Patent: Apr. 1, 2014

(54) METHOD AND SYSTEM FOR TESTING OSCILLATOR CIRCUIT

(75) Inventors: Jun Zhang, Suzhou (CN); Xiuqiang Xu, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 68 days.

(21) Appl. No.: 13/462,823

(22) Filed: May 3, 2012

(65) Prior Publication Data

US 2012/0293270 A1    Nov. 22, 2012

(30) Foreign Application Priority Data

May 19, 2011    (CN) .......................... 2011 1 0131708

(51) Int. Cl.
*H03L 5/00*        (2006.01)
*G01R 19/04*       (2006.01)

(52) U.S. Cl.
USPC .............. 331/44; 331/109; 331/183; 331/185

(58) Field of Classification Search
USPC ............. 331/15, 44, 109, 154, 158, 160, 182, 331/183, 185
See application file for complete search history.

(56) References Cited

U.S. PATENT DOCUMENTS

| | | | |
|---|---|---|---|
| 5,511,126 A | 4/1996 | Westwick | |
| 6,486,649 B1 | 11/2002 | Yin | |
| 6,504,436 B2 * | 1/2003 | Horikawa et al. | 331/11 |
| 6,653,908 B1 * | 11/2003 | Jones | 331/183 |
| 6,680,655 B2 * | 1/2004 | Rogers | 331/109 |
| 6,798,301 B1 * | 9/2004 | Balan et al. | 331/74 |
| 6,909,336 B1 * | 6/2005 | Rajagopalan et al. | 331/183 |
| 7,187,245 B1 * | 3/2007 | McMenamy | 331/158 |
| 7,292,114 B2 * | 11/2007 | Greenberg | 331/158 |
| 7,372,342 B2 * | 5/2008 | Berens | 331/116 R |
| 7,411,462 B2 | 8/2008 | Wallberg | |
| 7,516,377 B1 | 4/2009 | Buchanan | |
| 7,808,334 B2 * | 10/2010 | Yoshida et al. | 331/158 |
| 7,999,628 B2 * | 8/2011 | Miyashita | 331/176 |
| 8,102,217 B2 * | 1/2012 | Aoki | 331/160 |
| 8,487,709 B2 * | 7/2013 | Ishikawa et al. | 331/160 |
| 2008/0048795 A1 * | 2/2008 | Hoshino et al. | 331/183 |
| 2010/0237954 A1 | 9/2010 | Hall | |

* cited by examiner

*Primary Examiner* — Levi Gannon
(74) *Attorney, Agent, or Firm* — Charles Bergere

(57) ABSTRACT

An oscillator circuit generates a voltage signal. The magnitude of the voltage signal is measured and compared with predetermined upper and lower voltage signals by an internal test circuit. If the magnitude of the voltage signal is between the predetermined upper and lower voltage signals, then a pass test status signal is generated. If the magnitude of the voltage signal is not between the predetermined upper and lower voltage signals then a fail test status signal is generated.

8 Claims, 5 Drawing Sheets

METHOD AND SYSTEM FOR TESTING OSCILLATOR CIRCUIT

BACKGROUND OF THE INVENTION

The present invention relates to electronic circuits, and more specifically to a method and system for testing an oscillator circuit.

Oscillator circuits are an integral part of modern electronic circuits, especially microprocessor and microcontroller based circuits. An oscillator circuit, such as a PLL (Phase Locked Loop) circuit and a crystal oscillator circuit, is used to generate a clock signal, which is used to synchronize operations between various elements of an electronic circuit.

Crystal oscillator circuits are commonly used in the microprocessor and microcontroller based circuits for generating an oscillating signal. The microprocessor includes an on-chip circuit for generating a clock signal from the oscillating signal. Since, the circuit is on-chip, it may have some silicon faults that can hamper its operation, thereby producing a faulty clock signal. It is therefore essential to test the on-chip circuit to ensure generation of a correct clock signal.

Various testing techniques have been used to test the on-chip circuit. One test technique is to test the oscillation frequency with an external crystal having 100% fault coverage. In such case, the general start-up time is around 500 ms-600 ms for a crystal oscillator with a 32 kHz crystal. Thus, this technique has a long production test time. This technique also cannot be used to test the silicon die before it has been packaged.

Another test technique requires using external voltage sources and an ammeter to test the oscillator circuit. FIG. 1 is a schematic diagram of an ammeter based system 100 for testing an oscillator circuit. The system includes an on-chip inverter 102, which is connected between an EXTAL terminal 104 and an XTAL terminal 106. The system 100 also includes a first voltage source 108 connected to the EXTAL terminal 104 and a second voltage source 110 connected to an ammeter 112, which in-turn is connected to the XTAL terminal 106.

FIG. 2 is a flowchart 200 illustrating a method for testing the oscillator circuit with the system 100. The method includes two tests, the first test of which is shown in FIG. 2.

At step 202, a first voltage signal is applied from the second voltage source 110 at the XTAL terminal 106 and the EXTAL terminal 104 is grounded. The inverter 102 draws a current signal, corresponding to the first voltage signal, from the second voltage source 110. At step 204, the current drawn from the voltage source 110 is measured using the ammeter 112. At step 206, a check is performed to determine whether the magnitude of the measured current is within predefined limits. If the measured current is within the predefined limit, then at step 208 a pass status signal is generated; otherwise a fail status signal is generated at step 210.

Subsequent to the first test, a second test is performed in which the XTAL terminal 106 is grounded and a second voltage signal from the second voltage source 108 is applied at the EXTAL terminal 104. Then the method described above from steps 204 to 210 is repeated to detect silicon faults. In other words, the magnitude of the voltage signals generated by the first and second voltage sources 108, 110 are varied in order to cover all the silicon faults present in the oscillator circuit.

This conventional testing technique requires a long setup time to insure adequate test accuracy. Thus, the production test time is long and the fault coverage is relatively low. Further, use of external voltage sources and an external ammeter increases cost. Accordingly, there is need for a system for testing an oscillator circuit that has a low production test time and high fault coverage.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention a method for testing an oscillator circuit is provided in which the oscillator circuit is one of an inverter based oscillator circuit or an ALC (Amplitude Loop Control) oscillator circuit. The oscillator circuit generates a voltage signal. The method includes, measuring the magnitude of the voltage signal and comparing the magnitude of the voltage signal with a predetermined first and second voltage signals by an internal test to generate a test status signal that indicates either a pass or fail test status for the oscillator circuit.

In another embodiment of the present invention a system for testing an oscillator circuit is provided. The system includes an inverter connected between an input terminal and an output terminal of the oscillator circuit. The inverter is configured to operate based on a DC bias point voltage. The system includes a first switch connected in parallel to the inverter and a second switch connected in series with the first switch and to an internal test circuit. The internal test circuit generates a test status signal by comparing the magnitude of the DC bias point voltage with predetermined first and second voltage levels.

In yet another embodiment of the present invention a system for testing an oscillator circuit is provided. The oscillator circuit receives a DC signal from an input terminal of the oscillator circuit. The system includes a bias circuit for generating a bias current signal and an amplitude detector that is connected to the bias circuit and to an input terminal of the oscillator circuit. The amplitude detector generates a bias voltage signal based on the DC signal received from the input terminal of the oscillator. An amplifier receives the bias voltage signal from the amplitude detector and generates an output voltage signal based on the bias voltage signal. A plurality of switches is connected to the amplifier to control the operation of the amplifier based on a control signal. A resistance element is connected to the amplifier and the plurality of switches. The output voltage signal from the amplifier is generated across the resistive element. A comparator compares the output voltage signal with first and second voltage levels to generate a test status signal.

Figure 1:
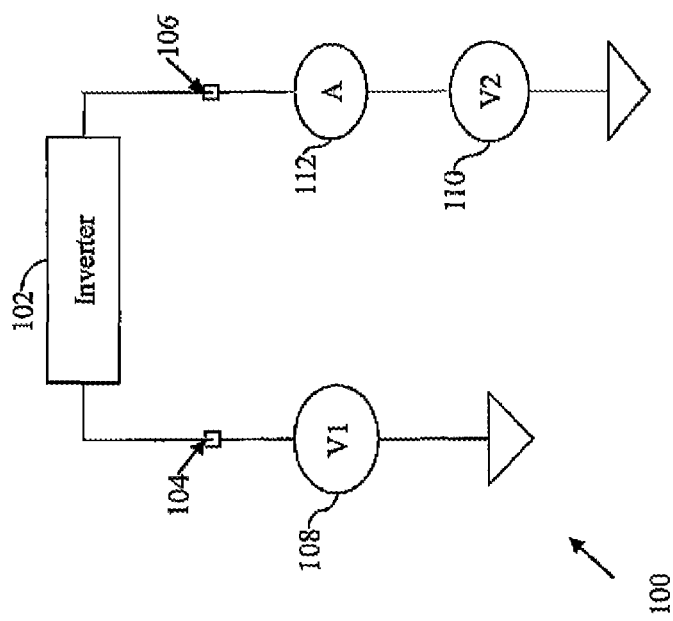
FIG. 1 is a schematic diagram of a conventional system for testing an oscillator circuit.
Figure 2:
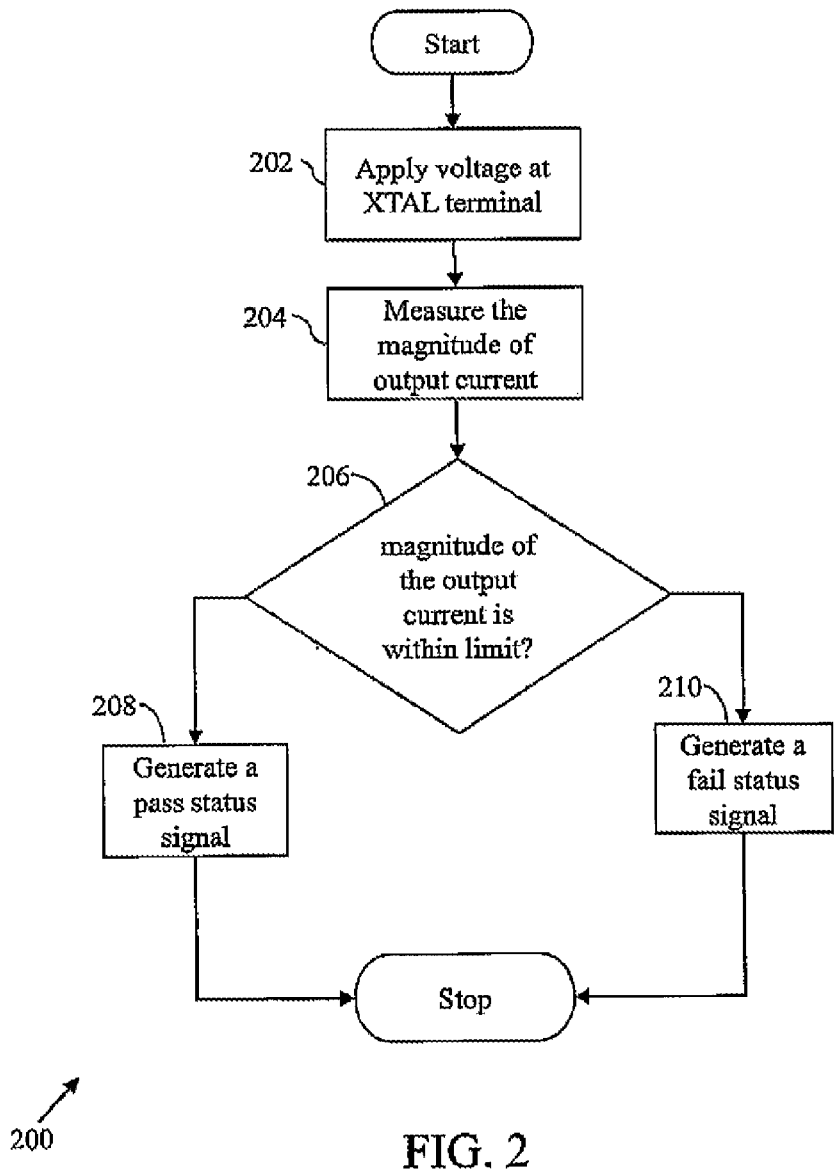
FIG. 2 is a flow chart illustrating a conventional method for testing an oscillator circuit.
Figure 3:
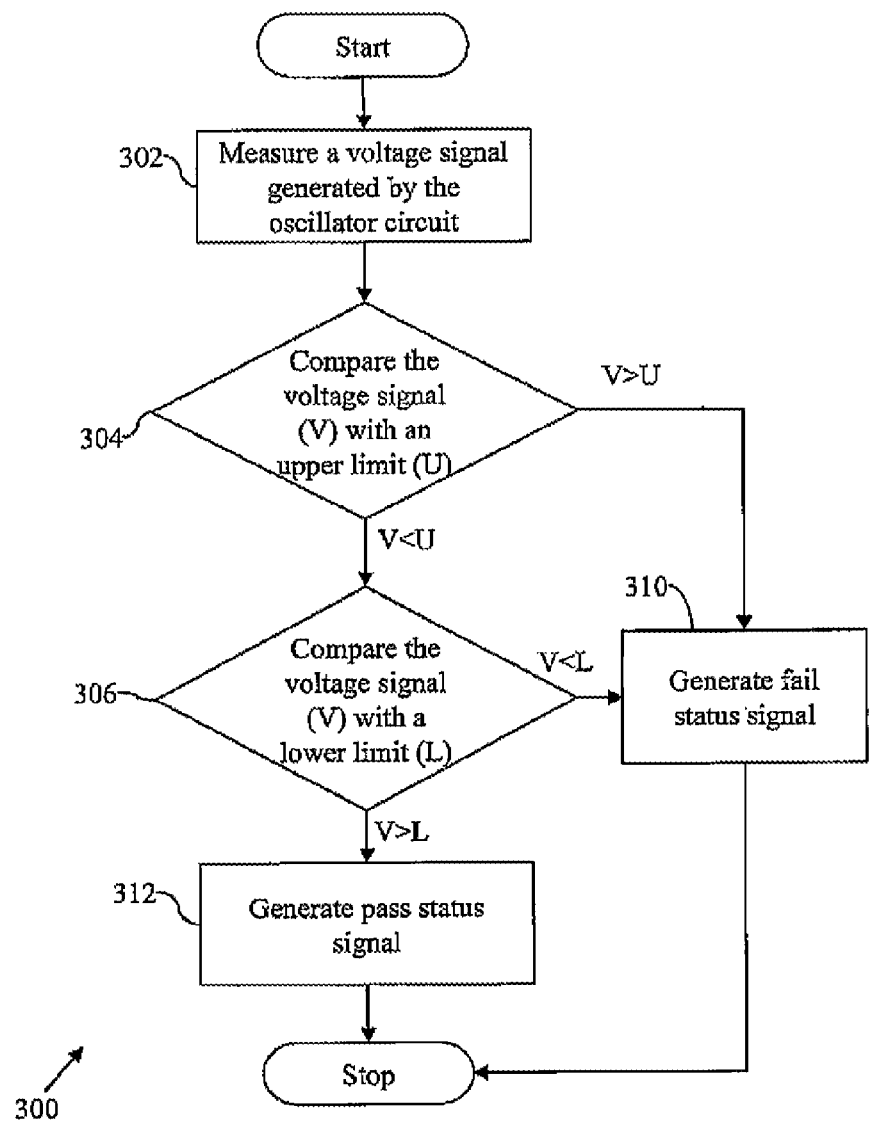
FIG. 3 is a flow chart illustrating a method for testing an oscillator circuit in accordance with an embodiment of the present invention.

Referring now to FIG. 3, a flow chart 300 illustrating a method for testing an oscillator circuit in accordance with an embodiment of the present invention is shown. At 302, a voltage signal generated by the oscillator circuit is measured. In an embodiment of the present invention, the oscillator circuit is an inverter based oscillator circuit. In another embodiment of the present invention, the oscillator circuit is an ALC (Amplitude Loop Control) based oscillator circuit. The generation of the voltage signal is explained later in conjunction with FIGS. 4 5. At 304 the voltage signal is compared with an upper limit voltage signal. If, at 304, it is determined that the magnitude of the voltage signal is greater than the upper limit voltage signal then, at 310, a fail test status signal is generated. However, if at 304, it is determined that the magnitude of the voltage signal is less than the upper voltage limit then, at 306, the voltage signal is compared with a lower limit voltage signal. If, at 306, it is determined that the magnitude of the voltage signal is less than the lower limit voltage signal then step 310 is performed. At 310, a fail test status signal is generated. However, if at 306, it is determined that the magnitude of the voltage signal is greater than the lower limit voltage signal then, at 308, a pass test status signal is generated. In an embodiment of the present invention, the upper and lower limit voltages are set based on the magnitude of the voltage signal generated by the oscillator circuit. For example, in one embodiment of the invention, the upper limit voltage is 120% of the magnitude of the voltage signal and the lower limit voltage signal is 80% of the magnitude of the voltage signal.

Figure 4:
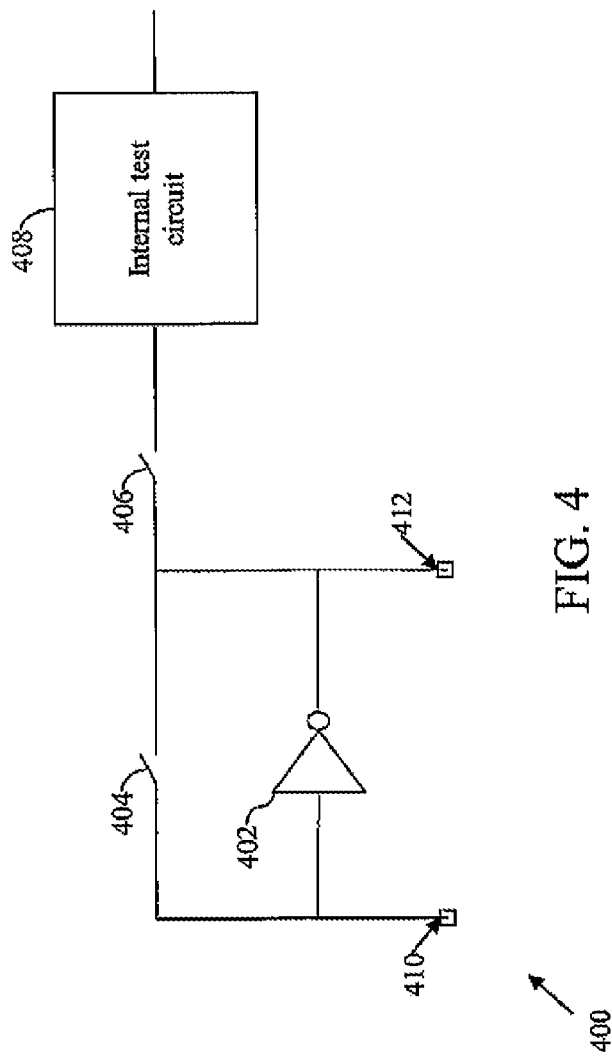
FIG. 4 is a schematic diagram of a system for testing an inverter based oscillator circuit in accordance with an embodiment of the present invention.

FIG. 4 is a block diagram of a system 400 for testing an inverter based oscillator circuit in accordance with an embodiment of the present invention. The system 400 includes an inverter 402, a first switch 404, a second switch 406, and an internal test circuit 408. The inverter 402 is connected between an input terminal 410 and an output terminal 412. In an embodiment of the present invention, the inverter 402 is an amplifier, which is the device under test. The first switch 404 is connected in parallel to the inverter 402 and the second switch 406 is connected in series with the first switch 404 and the internal test circuit 408. In an embodiment of the invention, the internal test circuit 408 is an ADC (Analog to Digital Converter).

For testing the inverter based oscillator circuit, the first and second switches 404 and 406 are switched to an ON state. The internal test circuit 408 is connected to the inverter 402 via the second switch 406. In one embodiment of the invention, the inverter 402 includes a PMOS transistor and an NMOS transistor, which operate at a DC bias point voltage when the first switch 404 is switched to the ON state. The magnitude of the DC bias point voltage is determined by the size ratio of the PMOS and NMOS transistors. For instance, if the size ratio of the PMOS and NMOS transistors is the same, the DC bias voltage for both the NMOS and PMOS transistors is the same. In an embodiment of the present invention, the system 400 is used for testing an oscillator circuit that includes a plurality of inverters that further include a plurality of NMOS transistors and a plurality of PMOS transistors having the same size ratio. Due to this same size ratio, the DC bias point voltages of the plurality of inverters are the same.

Switching the first switch 404 to the ON state leads to the generation of the DC bias point voltage across the input terminal 410 and the output terminal 412. Since the second switch 406 is in the ON state, the DC bias point voltage is detected by the internal test circuit 408. The internal test circuit 408 compares the magnitude of the DC bias point voltage with a predetermined upper limit voltage level and a predetermined lower limit voltage level. If the magnitude of the DC bias point voltage lies between the predetermined upper and lower limit voltage levels, a pass test status signal is generated. The pass test status signal indicates that the inverter based oscillator circuit is not faulty. However, if the magnitude of the DC bias point voltage does not lie between the predetermined upper and lower limit voltage levels, a fail test status signal is generated. The fail test status signal indicates that the inverter based oscillator circuit is faulty. In an embodiment of the present invention the upper limit voltage level and the lower limit voltage level are determined based on the DC bias voltage of the inverter 402.

In another embodiment of the present invention, the system 400 is used for testing an oscillator circuit that includes a single inverter using a dummy inverter with the same size ratio as that of the single inverter.

Figure 5:
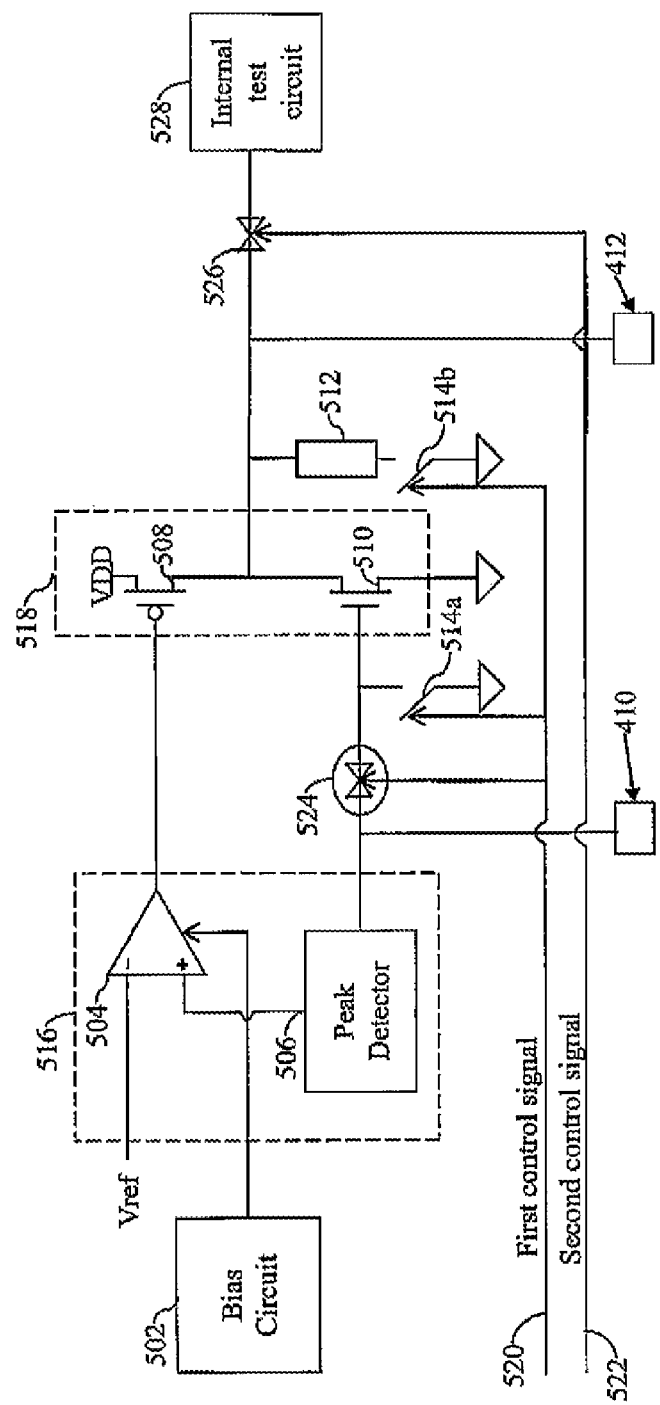
FIG. 5 is a schematic diagram of a system for testing an ALC (Amplitude Loop Control) based oscillator circuit in accordance with an embodiment of the present invention.

FIG. 5 is a diagram of a system 500 for testing an ALC based oscillator circuit in accordance with an embodiment of the present invention. The system 500 includes a bias circuit 502, a first amplifier 504, a peak detector 506, a PMOS transistor 508, an NMOS transistor 510, a resistance element 512, a first switch 514a, a second switch 514b, a third switch 524, a fourth switch 526, and an internal test circuit 528. The system 500 receives a first control signal 520 and a second control signal 522 for controlling the switching of the first, second, third and fourth switches 514a, 514b, 524, and 526. The bias circuit 502 includes a current mirror circuit (not shown) and a resistor (not shown) connected to the current mirror circuit.

The bias circuit 502 is connected to the first amplifier 504. The positive input terminal of the first amplifier 504 is connected to the peak detector 506 and the negative terminal of the first amplifier 504 receives a reference voltage signal generated by an on-chip circuit (not shown). The output terminal of the first amplifier 504 is connected to the gate terminal of the PMOS transistor 508. In an embodiment of the present invention the first amplifier 504 and the peak detector 506 together form an amplitude detector circuit 516. The source terminal of the PMOS transistor 508 is connected to a voltage source (VDD) and the drain terminal of the PMOS transistor 508 is connected to the drain terminal of the NMOS transistor 510. The drain terminal of the PMOS transistor 508 also is connected to the resistance element 512. The source terminal of the NMOS transistor 510 is grounded. In an embodiment of the present invention the NMOS transistor 510 and the PMOS transistor 508 connected as described above form a second amplifier 518, which is the amplifier of the ALC based oscillator under test. In an embodiment of the invention, the amplifier 518 is a MOSFET based amplifier. The gate terminal of the NMOS transistor 510 is connected to the peak detector 506 through the third switch 524. The gate terminal of the NMOS transistor 510 also is connected to the first switch 514a. The peak detector 506 is connected to the input terminal 410.

The system 500 receives the first and second control signals 520 and 522. The first control signal 520 controls the switching of the first switch 514a, second switch 514b and third switch 524. On receiving the first control signal 520, the first and second switches 514a and 514b switch to an ON state while the third switch 524 switches to an OFF state. Since the first switch 514a is ON, the gate terminal of the NMOS transistor 510 is grounded. The peak detector 506 receives a DC signal from the input terminal 410. On receiving the DC signal, the peak detector 506 generates a voltage signal having a magnitude equal to the magnitude of the reference voltage signal. The output voltage signal is transmitted to the positive terminal of the first amplifier 504. The first amplifier 504 also receives a bias current signal from the bias circuit 502. In an embodiment of the present invention, the bias current signal is inversely proportional to the resistor in the bias circuit 502. In another embodiment of the present invention, the first amplifier 504 operates based on a tail current of the first amplifier 504, which is a multiple of the bias current signal received from the bias circuit 502. The first amplifier 504 generates a bias voltage signal based on the voltage signal from the peak detector 506 and the reference voltage signal. The bias voltage signal is applied at the gate terminal of the PMOS 508. Since the gate terminal of the NMOS transistor 510 is grounded, the NMOS transistor 510 is operating in the cut-off region. Thus, the PMOS transistor 508 generates an output current signal based on the bias voltage signal. In an embodiment of the present invention, the output current signal is a multiple of the tail current when the magnitude of the reference voltage is the same as the magnitude of the DC voltage. It should be understood by those of skill in the art that the output current is M times the bias current signal from the bias circuit 502, where 'M' is the multiplication factor between the bias circuit 502 and the PMOS transistor 508. It also should be known by those of skill in the art that since the bias current signal is inversely proportional to the resistor in the bias circuit 502, the output current signal flowing through the PMOS transistor 508 is also inversely proportional to the resistor in the bias circuit 502. The output current flows through the resistance element 512 to generate an output voltage signal. In a preferred embodiment, the type of the resistance element 512 is the same as the resistor of the bias circuit 502, and the magnitude of the resistance element 512 is proportional to the magnitude of the resistor in the bias circuit 502. For this reason, the output voltage signal formed across the resistance element 512 is a linear function of the bias current signal from the bias circuit 502 and corresponds to the whole circuit from bias circuit 502 to the PMOS transistor 508.

The output voltage signal is transmitted to the internal test circuit 528. The internal test circuit 528 compares the magnitude of the output voltage signal with a predetermined upper limit voltage level and a predetermined lower limit voltage level. If it is determined that the magnitude of the output voltage signal lies between the predetermined upper and lower limit voltage levels, a pass test status signal is generated. The pass test status signal indicates that the ALC based oscillator circuit is not faulty. However, if it is determined that the magnitude of the DC bias point voltage does not lie between the predetermined upper and lower limit voltage levels, a fail test status signal is generated. The fail test status signal indicates that the ALC based oscillator circuit is faulty. In an embodiment of the present invention the upper and lower limit voltages are set based on the magnitude of the voltage signal generated by the oscillator circuit. For example, in one embodiment of the invention, the upper limit voltage is 120% of the magnitude of the voltage signal and the lower limit voltage signal is 80% of the magnitude of the voltage signal. In another embodiment of the present invention, the output voltage signal formed across the resistance element 512 is a linear function of the output of bias circuit 502, amplitude detector 516, and the PMOS transistor 508.

Thus the output voltage corresponds to the complete circuit and any discrepancy in the circuit is reflected in the output voltage signal.

The method and the system described above have numerous advantages. The system has higher production test coverage and a shorter production test time with only a very small layout size increase. The system described above does not require external voltage sources and an ammeter to test the oscillator circuit. Instead of the external voltage sources and external ammeter, the system uses a voltage signal, generated internally, to test the oscillator circuit. Thus, the test time is reduced. Further, the above described system and method for testing the oscillator circuit is more efficient in comparison to the conventional methods and system. And as the method does not need to conduct frequency/time measurement, the method is suitable for lower cost testers.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for testing an oscillator circuit, the oscillator circuit receiving a DC signal from an external source, the system comprising:
a bias circuit for generating a bias current signal;
an amplitude detector connected to the bias circuit and to an input terminal of the oscillator circuit, wherein the amplitude detector generates a bias voltage signal based on a magnitude of the DC signal;
an amplifier receiving the bias voltage signal from the amplitude detector, wherein the amplifier generates an output voltage signal based on the bias voltage signal;
a plurality of switches connected to the amplifier for controlling the operation of the amplifier based on a control signal;
a resistance element, connected to the amplifier and the plurality of switches, wherein the output voltage is generated across the resistance element; and
a comparator that compares the output voltage with first and second voltage levels and generates a test status signal.

2. The system claim 1, wherein the bias circuit is a current mirror circuit.

3. The system of claim 1, wherein the amplifier is a MOSFET based amplifier.

4. The system of claim 1, wherein the amplifier comprises:
a PMOS transistor having a gate terminal connected to the amplitude detector circuit, a source terminal connected to a voltage supply, and a drain terminal connected to the resistance element; and
an NMOS transistor having a gate terminal connected to a first switch of the plurality of switches, a drain terminal connected to the resistance element, and a source terminal connected to ground.

5. The system of claim 4, wherein the resistance element is connected to a second switch of the plurality of switches.

6. The system of the claim 1, wherein the plurality of switches are switched to at least one of an ON state and an OFF state at the same time.

7. The system of claim 1, wherein the test status signal signifies at least one of a pass status and a fail status of the oscillator circuit.

8. The system of claim 1, wherein the first and second voltage levels are determined based on the output voltage.

* * * * *